(12) United States Patent
Sager et al.

(10) Patent No.: US 8,809,678 B2
(45) Date of Patent: Aug. 19, 2014

(54) COATED NANOPARTICLES AND QUANTUM DOTS FOR SOLUTION-BASED FABRICATION OF PHOTOVOLTAIC CELLS

(75) Inventors: Brian M. Sager, Menlo Park, CA (US);
Dong Yu, Menlo Park, CA (US);
Matthew R. Robinson, East Palo Alto, CA (US)

(73) Assignee: aeris CAPITAL Sustainable IP Ltd., Grand Cayman (KY)

( * ) Notice: Subject to any disclaimer, the term of this patent is extended or adjusted under 35 U.S.C. 154(b) by 0 days.

(21) Appl. No.: 13/465,084

(22) Filed: May 7, 2012

(65) Prior Publication Data

US 2012/0211074 A1    Aug. 23, 2012

Related U.S. Application Data

(62) Division of application No. 11/954,183, filed on Dec. 11, 2007, now Pat. No. 8,193,442, which is a division of application No. 10/943,657, filed on Sep. 18, 2004, now Pat. No. 7,306,823.

(51) Int. Cl.
*H01L 31/04* (2014.01)
*B05D 5/12* (2006.01)
*H01B 1/02* (2006.01)
*B41F 31/00* (2006.01)

(52) U.S. Cl.
USPC ........... 136/262; 136/264; 136/265; 427/123; 427/124; 427/125; 427/126.1; 427/126.5; 427/215; 427/216; 427/217; 427/250; 427/74; 427/76; 977/773; 977/857; 977/890; 977/892; 438/57; 438/84; 438/85; 438/86; 438/93; 428/403; 428/570

(58) Field of Classification Search
USPC .......... 136/262, 264, 265; 427/123, 124, 125, 427/126.1, 126.5, 215, 216, 217, 250, 74, 427/76; 977/773, 857, 890, 892; 438/57, 438/84, 85, 86, 93; 428/403, 570
See application file for complete search history.

(56) References Cited

U.S. PATENT DOCUMENTS

| | | | |
|---|---|---|---|
| 3,423,301 | A | 1/1969 | Stearns |
| 3,586,541 | A | 6/1971 | Chamberlin |

(Continued)

FOREIGN PATENT DOCUMENTS

| | | |
|---|---|---|
| DE | 2741954 A | 3/1979 |
| EP | 793277 A | 9/1997 |

(Continued)

OTHER PUBLICATIONS

A G. Munoz, S. B. Saidman, and J. B. Bessone, Electrodeposition of Indium onto Vitreous Carbon from Acid Chloride Solutions, Journal of The Electrochemical Society, 1999, 2123-2130, vol. 146, No. 6, Electrochemical Society Inc: USA.

(Continued)

*Primary Examiner* — Golam Mowla
(74) *Attorney, Agent, or Firm* — Joshua D. Isenberg; JDI Patent

(57) ABSTRACT

CIGS absorber layers fabricated using coated semiconducting nanoparticles and/or quantum dots are disclosed. Core nanoparticles and/or quantum dots containing one or more elements from group 13 and/or IIIA and/or VIA may be coated with one or more layers containing elements group IB, IIIA or VIA. Using nanoparticles with a defined surface area, a layer thickness could be tuned to give the proper stoichiometric ratio, and/or crystal phase, and/or size, and/or shape. The coated nanoparticles could then be placed in a dispersant for use as an ink, paste, or paint. By appropriate coating of the core nanoparticles, the resulting coated nanoparticles can have the desired elements intermixed within the size scale of the nanoparticle, while the phase can be controlled by tuning the stoichiometry, and the stoichiometry of the coated nanoparticle may be tuned by controlling the thickness of the coating(s).

15 Claims, 4 Drawing Sheets

(56) References Cited

U.S. PATENT DOCUMENTS

| | | | |
|---|---|---|---|
| 3,818,324 A | 6/1974 | Espinasse | |
| 3,891,519 A | 6/1975 | Grellet | |
| 3,903,427 A | 9/1975 | Pack | |
| 3,903,428 A | 9/1975 | DeJong | |
| 3,907,566 A | 9/1975 | Inoue et al. | |
| 3,966,568 A | 6/1976 | Crossley et al. | |
| 4,104,134 A | 8/1978 | Roberts et al. | |
| 4,191,794 A | 3/1980 | Shirland et al. | |
| 4,192,721 A | 3/1980 | Fawcett et al. | |
| 4,404,422 A | 9/1983 | Green et al. | |
| 4,410,758 A | 10/1983 | Grolitzer | |
| 4,522,663 A | 6/1985 | Ovshinsky et al. | |
| 4,536,607 A | 8/1985 | Wiesmann | |
| 4,598,306 A | 7/1986 | Nath et al. | |
| 4,622,432 A | 11/1986 | Yamazaki | |
| 4,642,140 A | 2/1987 | Noufi et al. | |
| 4,677,250 A | 6/1987 | Barnett et al. | |
| 4,806,436 A | 2/1989 | Tada et al. | |
| 4,940,604 A | 7/1990 | Suyama et al. | |
| 5,045,409 A | 9/1991 | Eberspacher et al. | |
| 5,078,804 A | 1/1992 | Chen et al. | |
| 5,141,564 A | 8/1992 | Chen et al. | |
| 5,244,509 A | 9/1993 | Arao et al. | |
| 5,275,714 A | 1/1994 | Bonnet et al. | |
| 5,277,786 A | 1/1994 | Kawakami | |
| 5,286,306 A | 2/1994 | Menezes | |
| 5,356,839 A | 10/1994 | Tuttle et al. | |
| 5,401,573 A | 3/1995 | Babel et al. | |
| 5,436,204 A | 7/1995 | Albin et al. | |
| 5,441,897 A | 8/1995 | Noufi et al. | |
| 5,445,847 A | 8/1995 | Wada et al. | |
| 5,489,372 A | 2/1996 | Hirano | |
| 5,501,786 A | 3/1996 | Gremion et al. | |
| 5,538,903 A | 7/1996 | Aramoto et al. | |
| 5,558,723 A | 9/1996 | Ufert | |
| 5,567,469 A | 10/1996 | Wada et al. | |
| 5,578,503 A | 11/1996 | Karg et al. | |
| 5,626,688 A | 5/1997 | Probst et al. | |
| 5,633,033 A | 5/1997 | Nishitani et al. | |
| 5,674,555 A | 10/1997 | Birkmire et al. | |
| 5,677,250 A | 10/1997 | Knapp | |
| 5,728,231 A | 3/1998 | Negami et al. | |
| 5,730,852 A | 3/1998 | Bhattacharya et al. | |
| 5,925,228 A | 7/1999 | Panitz et al. | |
| 5,985,691 A | 11/1999 | Basol et al. | |
| 5,994,163 A | 11/1999 | Bodegard et al. | |
| 6,107,562 A | 8/2000 | Hashimoto et al. | |
| 6,117,454 A | 9/2000 | Kreuter et al. | |
| 6,121,541 A | 9/2000 | Arya | |
| 6,124,039 A | 9/2000 | Goetz et al. | |
| 6,126,740 A | 10/2000 | Schulz et al. | |
| 6,127,202 A * | 10/2000 | Kapur et al. | 438/47 |
| 6,228,904 B1 | 5/2001 | Yadav et al. | |
| 6,258,620 B1 | 7/2001 | Morel et al. | |
| 6,268,014 B1 | 7/2001 | Eberspacher et al. | |
| 6,323,417 B1 | 11/2001 | Gillespie et al. | |
| 6,344,272 B1 | 2/2002 | Oldenburg et al. | |
| 6,372,538 B1 | 4/2002 | Wendt et al. | |
| 6,472,459 B2 | 10/2002 | Morales et al. | |
| 6,500,733 B1 | 12/2002 | Stanbery | |
| 6,518,086 B2 | 2/2003 | Beck et al. | |
| 6,685,986 B2 | 2/2004 | Oldenburg et al. | |
| 6,897,603 B2 | 5/2005 | Mao et al. | |
| 6,908,496 B2 | 6/2005 | Halas et al. | |
| 6,951,398 B2 | 10/2005 | Borra et al. | |
| 6,974,976 B2 | 12/2005 | Hollars | |
| 7,144,627 B2 | 12/2006 | Halas et al. | |
| 7,306,823 B2 | 12/2007 | Sager et al. | |
| 8,193,442 B2 | 6/2012 | Sager et al. | |
| 2002/0006470 A1 | 1/2002 | Eberspacher et al. | |
| 2002/0132045 A1 | 9/2002 | Halas et al. | |
| 2002/0160195 A1 | 10/2002 | Halas et al. | |
| 2002/0187347 A1 | 12/2002 | Halas et al. | |
| 2003/0059820 A1 | 3/2003 | Vo-Dinh | |
| 2003/0175004 A1 | 9/2003 | Garito et al. | |
| 2004/0033345 A1 | 2/2004 | Dubertret et al. | |
| 2004/0214001 A1 | 10/2004 | Oldenburg et al. | |
| 2004/0219730 A1 * | 11/2004 | Basol | 438/200 |
| 2005/0035983 A1 | 2/2005 | Cruchon-Dupeyrat et al. | |
| 2005/0058587 A1 | 3/2005 | Wagner | |
| 2005/0074551 A1 | 4/2005 | Huang et al. | |
| 2005/0150789 A1 | 7/2005 | Crane | |
| 2005/0175836 A1 | 8/2005 | Kuehnle et al. | |
| 2005/0183767 A1 | 8/2005 | Yu et al. | |
| 2005/0183768 A1 | 8/2005 | Roscheisen et al. | |
| 2005/0186342 A1 | 8/2005 | Sager et al. | |
| 2005/0202589 A1 | 9/2005 | Basol | |
| 2005/0235869 A1 | 10/2005 | Cruchon-Dupeyrat et al. | |
| 2006/0054506 A1 | 3/2006 | Natan et al. | |
| 2006/0099146 A1 | 5/2006 | Chow et al. | |
| 2006/0134505 A1 | 6/2006 | Wang et al. | |
| 2006/0192955 A1 | 8/2006 | Jorgenson et al. | |
| 2006/0207644 A1 | 9/2006 | Robinson et al. | |
| 2006/0251874 A1 | 11/2006 | McClure et al. | |

FOREIGN PATENT DOCUMENTS

| | | |
|---|---|---|
| JP | 6289369 | 4/1987 |
| JP | 63249379 | 10/1988 |
| KR | 2005119705 | 12/2005 |
| KR | 20050119705 A | 12/2005 |
| WO | 03043736 A | 5/2003 |
| WO | WO03043736 | 5/2003 |

OTHER PUBLICATIONS

A. Kampmann, P. Cowache, D. Lincot, and J. Vedel, Junction Formation Studies of One-Step Electrodeposited $CuInSe_2$ on CdS, Journal of The Electrochemical Society, 1999, 150-155, vol. 146, No. 1, Royal Society of Chemistry (Great Britain).

C. Eberspacher, K. L. Pauls, and C. V. Fredric, Improved processes for forming $CuInSe_2$ films, UNISUN, 1-4, Newbury Park, CA.

C. Eberspacher, K. Pauls, and J. Serra, Non-vacuum processing of CIGS solar cells, UNISUN, 223-224, 2001, Newbury Park, CA.

C. Eberspacher, K. Pauls, and J. Serra, Non-vacuum processing of CIGS solar cells, UNISUN, pp. 1-5, 2003 Newbury Park, CA.

C. Guillen, and J. Herrero, Recrystallization and components redistribution processes in electrodeposited $CuInSe_2$ thin films, Thin Solid Films, 2001, 57-59, vol. 387, Elsevier Science, Amsterdam : Netherlands.

Chris Eberspacher, Chris Fredric, Karen Pauls, and Jack Serra, Thin-filme CIS alloy PV materials fabricated using non-vacuum, particles-based techniques, Thin Solid Films, 2001, 18-22, vol. 387, Elsevier Publishing Company, Amsterdam.

Chris Eberspacher, Karen L. Pauls, and John P. Serra, Non-vacuum thin-film CIGS modules, Materials Research Society Symposia Proceedings, 2003, B8.27.1-B8.27.6, vol. 763, Materials Research Society, Warrendale, PA.

Claire J. Carmalt, Daniel E. Morrison, and Ivan P. Parkin, Solid-state and solution phase metathetical synthesis of copper indium chalcogenides, Journal of Materials Chemistry, 1998, 2209-2211, vol. 8, No. 10, Royal Society of Chemistry (Great Britain).

D. Padhi, J. Yahalom, S. Gandikota, and G. Dixit, Planarization of Copper Thin Films by Electropolishing in Phosphoric Acid for ULSI Applications, Journal of the Electrochemical Society, 2003, G10-G14, vol. 150, No. 1, Electrochemical Society Inc : USA.

Douglas L. Schulz, Calvin J. Curtis, Rebecca A. Flitton, Holm Wiesner, James Keane, Richard J. Matson, Kim M. Jones, Philip A. Parilla, Rommel Noufi, and David S. Ginley, Cu—In—Ga—Se Nanoparticle Colloids as Spray Deposition Precursors for $Cu(In,Ga)Se_2$ Solar Cell Materials, Journal of Electronic Materials, 1998, 433-437, vol. 27, No. 5, Minerals Metals & Materials Society : USA.

F. Tepper et al, "Nanosized Alumina Fibers", Advanced Materials, American Ceramic Society Bulletin, vol. 80, No. 6, Jun. 2001.

Freeman et al., "Ag-Clad Au Nanoparticles: Novel Aggregation, Optical, and Surface-Enhanced Raman Scattering Properties", J. Phys. Chem., vol. 100, 1996, pp. 718-724.

G. Norsworthy, C.R. Leidholm, A. Halani, V.K. Kapur. R. Roe, B.M. Basol, and R. Matson, CIS film growth by metallic ink coating and

(56) References Cited

OTHER PUBLICATIONS selenization, Solar Energy Materials & Solar Cells, 2000, 127-134, vol. 60, Elsevier Science, Amsterdam: Netherlands.

George L. Schnable and John G. Javes, Electrodeposition of Molten Low-Melting Metals and Alloys from Fused-Salt Systems, Electrochemical Technology, Jul.-Aug. 1964, 201-206, Electrochemical Society, Manchester, N.H.

George L. Schnable, Electrodeposition of Molten Metals and Alloys from Glycerine Solutions, Journal of the Electrochemical Society, Oct. 1961, 964-969, vol. 108, No. 10, Electrochemical Society Inc : USA.

Granqvist, C.G. and R.A. Buhrman. "Ultrafine metal particles". J. Applied Physics 47 (5): 220-2219 (1976).

H. Yu, et al. "Heterogeneous Seed Growth: A Potentially General Synthesis of Monodisperse Metallic Nanoparticles" in J. Am. Chem. Soc. 2001, vol. 123, pp. 9198-9199.

Hambrock, J., Schroter, M.K., Birkner, A., Woll, C. and R.A. Fischer, "Nano-Brass: Bimetallic Copper / Zinc Colloids by a Nonacqueous Organometallic Route using [Cu(OCH(Me)CH2NMes)2] and Et2Zn as Precursors" Chem. Mater. 15: 4217-4222, (2003).

International Preliminary Report on Patentability for WO2006135377.

K.T. Ramakrishna Reddy, R.B.V. Chalapathy, M.A. Slifkin, A.W. Weiss, and R.W. Miles, Photoacousstic spectroscopy Of sprayed $CuGa_xIn_{1-x}Se_2$ thin films, Thin Solid Films, 2001, 205-207, vol. 387, Elsevier Science, Amsterdam: Netherlands.

K.T.L. De Silva, W.A.A. Priyantha, J.K.D.S. Jayanetti, B.D. Chithrani, W. Siripala, K. Blake, and I.M. Dharmadasa, Electrodeposition and characterization of $CuInSe_2$ for applications in thin film solar cells, Thin Solid Films, 2001, 158-163, vol. 382, Elseiver Science, Amsterdam : Netherlands.

M. Kaelin, D. Rudmann, F. Kurdesau, T. Meyer, H. Zogg, A.N. Tiwari, CIS and CIGS layers from selenized nanoparticle precursors, Thin Solid Films, 2003, 58-62. vol. 431-432, Elsevier Science, Amsterdam : Netherlands.

M. Kaelin, H. Zogg, A.N. Tiwari, O. Wilhelm, S.E. Pratsinis, T. Meyer, and A. Meyer, Electrosprayer and selenized Cu/ in metal particle films, Thin Solid Films, 2004, 391-396, vol. 457, Elsevier Science, Amsterdam : Netherlands.

Marianna Kemell, Heini Saloniemi, Mikko Ritala, and Markku Leskela, Electrochemical Quartz Crystal Microbalance Study of the Electrodeposition Mechanisms of $CuInSe_2$ Thin Films, Journal of the Electrochemical Society, 2001, C110-C118, vol. 148, No. 2, Electrochemical Society: USA.

Markus E. Beck, and Michael Cocivera, Thin-film copper indium diselenide prepared by selenization of copper indium oxide formed by spray pyrolysis, Thin Solid Films, 1996, 71-82, vol. 272, Elseiver Publishing Company, Amsterdam.

Non-Final Rejection of U.S. Appl. No. 10/943,657 (U.S. Patent No. 7,306.823) dated Feb. 9, 2007.

Notice of Allowance dated Jul. 25, 2007 for U.S. Appl. No. 10/943,657.

R.P. Raffaelle, J.G. Mantovani, S.G. Bailey, A.F. Hepp, E.M. Gordon and R. Haraway, Electrodeposited $CuInSe_2$ thin film junctions, Prepared for the 1997 Fall meeting sponsored by the Materials Research Society, Dec. 1-5, 1997, Boston, MA.

S. Sun, C. B. Murray, D. Weller, L. Folks, A. Moser, "Monodisperse FePt Nanoparticles and Ferromagnetic FePt Nanocrystal Superlattices", Science, 287, pp. 1989-1992 (Mar. 17, 2000).

Sedoi V.S., Valevich V.V ., Chemezova L.I. Production of submicron aerosols by the exploding wire method // Aerosols.—1998.—vol. 4e, No. 2.—pp. 41-47.

Sedoi V.S., Valevich V.V. "Direct production of nanosized powders by the exploding wire method" Physics, Chemistry & Applications of Nanostructures (Reviews).—In Russian.

Sedoi V.S., Valevich V.V., Katz J.D. Generation of aerosols by the electrical explosiion of wires at reduced air pressure // Aerosols.— 1998.—vol. 4e, No. 2.—p. 48-54.

Shixing Weng and Michael Cocivera, Preparation of copper indium diselenide by selenization of copper indium oxide, Journal of Applied Physics, Aug. 1, 1993, 2046-2052, vol. 74, No. 3, American Institute of Physics, New York.

Supporting information for H. Yu, et al. "Heterogeneous Seed Growth: A Potentially General Synthesis of Monodisperse Metallic Nanoparticles".

T. Arita, N. Suyama, Y. Kita, S. Kitamura, T. Hibino, H. Takada, K. Omura, N. Ueno, and M. Murozono, $CuInSe_2$ films prepared by screen-printing and sintering method, 1988, IEEE.

U.S. Appl. No. 10/698,988, to Brian Sager and Martin Roscheisen, filed Oct. 31, 2003, and entitled "Inorganic/Organic Hybrid Nanolaminate Barrier Film".

U.S. Appl. No. 10/782,017, to Dong Yu et al., filed Feb. 19, 2004, and entitled "Solution-Based Fabrication of Photovoltaic Cell".

Vijay K. Kapur, Ashish Bansal, Phucan Le, and Omar I. Asensio, Non-vacuum processing of $CuIn_{1-x}Ga_xSe_2$ solar cells on rigid and flexible substrates using nanoparticle precursor inks, Thin Solid Films, 2003, 53-57, vol. 431-432, Elsevier Publishing Company, Amsterdam.

William M. Saltman and Norman H. Nachtrieb, The Electrochemistry of Gallium, Journal of the Electrochemical Society, Mar. 1953, 126-130, vol. 100, No. 3, Electrochemical Society Inc: USA.

* cited by examiner

COATED NANOPARTICLES AND QUANTUM DOTS FOR SOLUTION-BASED FABRICATION OF PHOTOVOLTAIC CELLS

CROSS-REFERENCES TO RELATED APPLICATIONS

This application is a divisional of U.S. patent application Ser. No. 11/954,183 filed Dec. 11, 2007, which is a divisional of U.S. patent application Ser. No. 10/943,657 filed Sep. 18, 2004, now issued as U.S. Pat. No. 7,306,823 on Dec. 11, 2007, all of which are hereby incorporated by reference for all purposes.

FIELD OF THE INVENTION

This invention is related to photovoltaic cells and more particularly to fabrication of IB-IIIAVIA active layers for such cells.

BACKGROUND OF THE INVENTION

Low-cost production of solar cells on flexible substrates using printing or web coating technologies is promising a highly cost-efficient alternative to traditional silicon-based solar cells. Recently, solar cells with absorber layers fabricated by solution-based deposition of alloys of copper (Cu) and indium (In) with selenium (Se) or sulfur (S) have been developed. Such solar cells, generally referred to as GIGS cells, have been fabricated using different non-vacuum processes in which a precursor solution is formulated containing mixed oxides of Cu, In and Ga, which is then coated on a substrate. In particular, Kapur et al (U.S. Pat. No. 6,268,014, issued October 2000) describe a method for fabricating a solar cell based upon the solution-based deposition of a source material comprised of mechanically milled, oxide-containing, sub-micron sized particles, while Eberspacher and Pauls (U.S. Pat. No. 6,268,014, issued July 2001; US Patent Application Publication 20020006470) describe the forming of mixed metal oxide, sub-micron sized particles by pyrolizing droplets of a solution, then ultrasonically spraying the resulting particles onto a substrate.

However, there are several drawbacks to the use of metal oxides as precursor materials for GIGS solar cells. First, the use of oxide-based particles in CIGS absorber layer construction requires a high-temperature hydrogen reduction step to reduce the oxides. In addition to requiring substantial time and energy, this step is potentially explosive. Further, although it is highly desirable to incorporate gallium in the active layer of the solar cells, the presence of gallium results in the formation of gallium oxide upon annealing, a highly stable material which is very difficult to reduce even under the most extreme conditions. As a result, it is very difficult to effectively incorporate gallium into a nascent copper indium precursor film using a metal oxide synthesis approach.

In addition, the methods of particle formation and deposition taught in the prior art early significant challenges. For example, mechanical milling is a lengthy process that can requires substantial energy and take several tens of hours to achieve sub-micron sized particles. Further, even after milling, particles are rarely uniform, resulting in a substantial size distribution, which can result in poorly packed precursor films, leading to low-density absorber layers with poor optoelectronic and electronic properties. Spray pyrolysis of micron thick layers of precursor particles also has significant drawbacks. First, the ultrasonic spraying of thin layers of sub-micron sized particles onto a substrate is an inherently non-uniform process, resulting in differential drying rates as particles are spray deposited. Non-uniform drying can result from any of several factors including but not limited to differential drying on the substrate, mid-stream drying (e.g. drying of droplets prior to reaching a substrate), and pooling of particles and droplets into non-contiguous aggregates that leave space between the aggregation loci. Further, it is especially challenging to achieve any scaling for this technique since it is inherently difficult to carry out a uniform wet deposition of many small particle-containing droplets over a large area without any premature drying prior to completion of the deposition process. Films are often uneven and have substantial spatial non-uniformities across their surface. These and related forms of nonuniform drying lead to the formation of pockets and voids within the deposited film, creating a porous material which leads to a solar cell with poor and unstable optoelectronic and electronic properties. Some of these defects can be overcome when much thicker films are deposited, e.g. in the 20 to 100 micron thick range, but such films are not useful for solar cell devices, which typically require the absorber layer to have a thickness between about one and two microns.

Rapid drying of thin films also limits the potential scaleability of spray deposition techniques. For example, using a scrolling nozzle to spray deposit across a large surface area results in drying of the initially sprayed area prior to deposition of the final area to be deposited. This uneven drying results in additional spatial non-uniformities, pockets, and voids. While the use of multiple spray heads concurrently moving across a substrate surface decreases the time required for deposition across the total surface area, local non-uniformities can arise from regions near each of the nozzles as well as in overlapping regions.

For sub-micron precursor particles formed by either mechanical milling or spray pyrolysis, it is difficult to make precisely-shaped and sized nanoparticles of indium and gallium since indium is so soft and gallium is molten at room temperature. Small and uniformly-sized particles lead to more densely-packed films, which can improve device performance. Furthermore, the properties of the resulting CIGS absorber layer are highly dependent on the stoichiometric ratio of the elements in the layer. The stoichiometric ratios in the layer largely depend on the stoichiometric ratios in the nanoparticles in the precursor solution, while the initial crystalline phase of precursor materials impacts the feasibility of achieving a targeted final phase in the annealed absorber film. It is difficult to precisely tune the stoichiometry and/or phase of the nanoparticles on a nanometer scale with current techniques.

Thus, there is a need in the art, for a non-oxide, nanoparticle based precursor material that overcomes the above disadvantages.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention.

Accordingly, the exemplary embodiments of the invention described below are set forth without any loss of generality to, and without imposing limitations upon, the claimed invention.

The disadvantages associated with the prior art may be overcome by fabricating CIGS absorber layers using coated nanoparticles. Nanoparticles are discrete entities sized less than about 1000 nm, more preferably less than about 500 nm, and still more preferably less than about 250 nm. When the nanoparticles are sized less than about 10 nm, their chemical, physical, electronic, and optical properties often change relative to that of bulk material, and at about the 10 nm or less size scale, nanoparticles are also called "quantum dots".

Figure 1A:
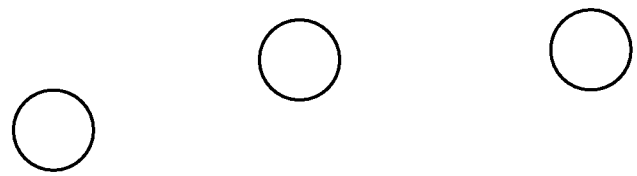
FIGS. 1A-1C are a sequence schematic diagrams illustrating formation of coated nanoparticles for a paint, ink, or paste for use in forming an absorber layer of a photovoltaic device according to an embodiment of the present invention.
Figure 1B:
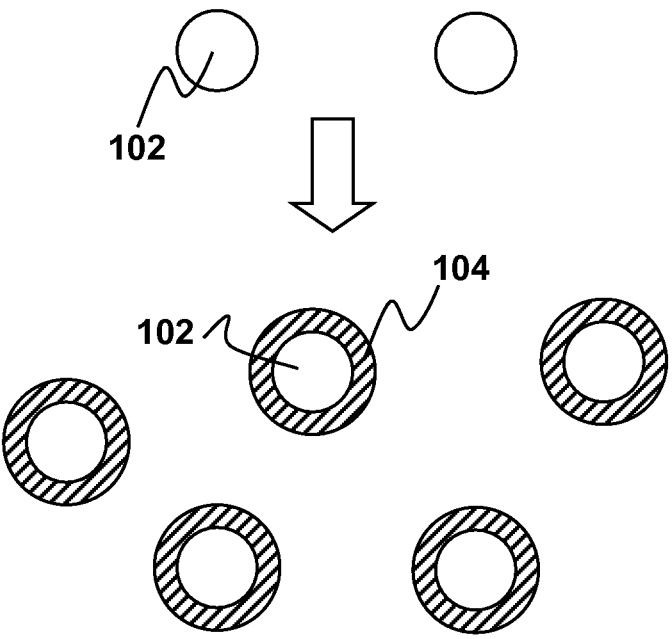
Figure 1C:
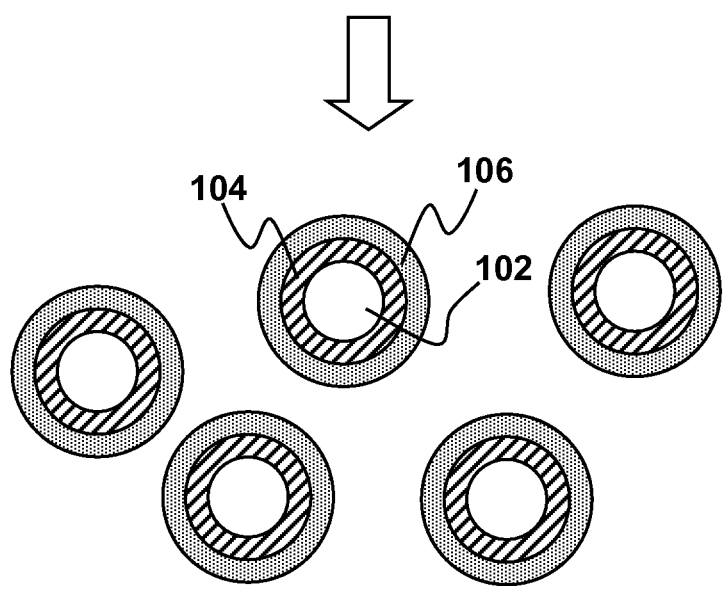

Various coatings could be deposited, either singly, in multiple layers, or in alternating layers, all of various thicknesses. Specifically, as shown in FIGS. 1A-1C, core nanoparticles 102 containing one or more elements from group IB and/or IIIA and/or VIA may be coated with one or more layers 104, 106 containing elements of group IB, IIIA or VIA to form coated nanoparticles. Preferably at least one of the layers contains an element that is different from one or more of the group IB, IIIA or VIA elements in the core nanoparticle. The group IB, IIIA and VIA elements in the core nanoparticle 102 and layers 104, 106 may be in the form of pure elemental metals or alloys of two or more metals. By way of example, and without limitation, the core nanoparticles may include elemental copper, or alloys of copper with gallium, indium, or aluminum and the layers 104 may be gallium, indium or aluminum.

Using nanoparticles with a defined surface area, a layer thickness could be tuned to give the proper stoichiometric ratio within the aggregate volume of the nanoparticle. By appropriate coating of the core nanoparticles, the resulting coated nanoparticles can have the desired elements intermixed within the size scale of the nanoparticle, while the stoichiometry (and thus the phase) of the coated nanoparticle may be tuned by controlling the thickness of the coating(s).

Prior to use in a solution-based formulation, individual nanoparticles formed by a dry synthesis technique are typically collected as a dry nanopowder. For nanoparticles formed by wet synthesis techniques, individual nanoparticles are typically formed in a solvent system where they are maintained as individual particles within the solution.

The coated nanoparticles could then be placed in a dispersant for use as a solution-based semiconductor formulation. The formulation can be in the form of an ink, paint or paste. Ink is defined as a "pigmented liquid". In contrast, a paint is defined as "a liquid mixture, usually of a solid pigment suspended in a liquid vehicle". A paste is defined as "any mixture of a soft and malleable consistency". A pigment is a material that selectively absorbs certain regions of the light spectrum.

By way of example, the core nanoparticles may be copper (Cu) nanoparticles. These core nanoparticles may be of any suitable diameter, e.g., between about 0.1 nm and about 1000 nm, more preferably between about 1 nm and about 500 nm, even more preferably between about 1 nm and 250 nm, still more preferably between about 1 nm and 100 nm, and most preferably between about 1 nm and 20 nm. If desired, the size distribution of the core nanoparticles may be narrowed, e.g., by ultrafiltration. In addition to nanoparticles, nanowires, nanorods, nanobelts, nanowiskers, and other shapes can be used for the core nanoparticles. Other nanoparticles can also be coated, e.g., a particle core comprised of metals other than Cu, or comprised of an organic material such as polystyrene.

The core nanoparticles may be obtained by purchase of suitable commercially available nanoparticle materials. Alternatively the core nanoparticles may be formed by a suitable method. Several methods are available for the formation of nanoparticles, including but not limited to dry-synthesis techniques such as evaporation-condensation (Granqvist and Buhrman, 1976, "Ultrafine metal particles", J. Applied Physics 47 (5): 220-2219); and the electro-explosion of wire (Tepper, "Nanosized Alumina Fibers", Advanced Materials, American Ceramic Society Bulletin, Vol. 80, No. 6, June 2001), and wet chemical techniques such as organometallic synthesis of colloids (Hambrock et al., "Nano-Brass: Bimetallic Copper/Zinc Colloids by a Nonacqueous Organometallic Route using [Cu(OCH(Me)CH2NMes)$_2$] and Et2Zn as Precursors" Chem. Mater. 15: 4217-4222, (2003)), metal-salt reduction (E. E. Carpenter., C. T. Seip, C. J. O'Connor, J. Appl. Phys., 85, 5164 (1999)), redox transmetalation reaction in warm toluene solution (J. Park, J. Cheon, J. Am. Chem. Soc., 123, 5743 (2001)), the creation of nanoparticles by electrochemistry (e.g. anodization in an oxygen-free, sonicated environment containing a surfactant) (see Chem. Fur. J. 2001, 7, 1084), and a combination of high temperature decomposition of a metal carbonyl precursor and the reduction of a metal salt in the presence of surfactants (S. Sun, C. B. Murray, D. Weller, L. Folks, A. Moser, Science, 287, 1989 (2000)).

As used herein, "obtaining" core nanoparticles includes both purchase of the core nanoparticles and formation of the core nanoparticles. For example, the core nanoparticles 102 may be formed by electro-explosion of copper wires. Cu nanopowders can also be obtained commercially. For example, Cu nanoparticles are available commercially, e.g., from Materials Modification Inc., of Fairfax, Va. Layer 104 may be a layer of gallium (Ga) or indium (In). Layer 106 may be a layer of aluminum and/or indium.

There are many variations on the embodiment described above, for example, the core nanoparticles 102 may be made of indium and the layers 104, 106 may include copper, and/or gallium and/or aluminum. Alternatively, the core nanoparticles 102 may be aluminum and the layers 104, 106 may include copper, and/or gallium and/or indium. Since, gallium is liquid at room temperature, it is usually undesirable for the outer layer 106 to be gallium metal. Otherwise, the molten gallium will tend to cause the resulting nanoparticles stick together. Thus the coated particles would likely be unstable under typical manufacturing conditions. The layers 104, 106 may optionally include a layer of a group VIA element such as selenium (Se) or sulfur (S). Thus, the coating steps may produce Cu—In—Ga or Cu—In—Ga(Se, S) nanoparticles for use in an ink, paste, and/or paint for solution deposition of an absorber layer in a photovoltaic cell.

In a variation on the above embodiment, bimetallic core nanoparticles containing two or more different elements, e.g., nanoparticles comprised of solid solutions or alloys of Cu—Ga, Cu—Al, or Cu—In, may be coated with one or more layers of metal such as Cu, In, Ga, or Al. Bimetallic nanoparticles may be obtained, e.g., by reducing metal salts onto metallic nanoparticles. In an alternative approach, bi metallic nanoparticles can be formed via evaporation-condensation techniques using a bimetallic source, or through co-evaporationcondensation techniques using more than one source. In addition, wet chemical techniques can also be used to form bimetallic nanoparticles through the combination of more than one metal precursor, e.g. for use in a metal salt reduction, organometallic colloid synthesis, and/or redox transmetalation reaction. Alternatively, bimetallic nanoparticles may be obtained by electro-explosion of bimetallic wires. For example, core Cu—Ga nanoparticles may be obtained by electro-explosion of Cu—Ga wires. In this example, the core nanoparticles 102 may be a solid solution of copper and gallium and the layers 104, 106 may include indium and/or aluminum.

Figure 2A:
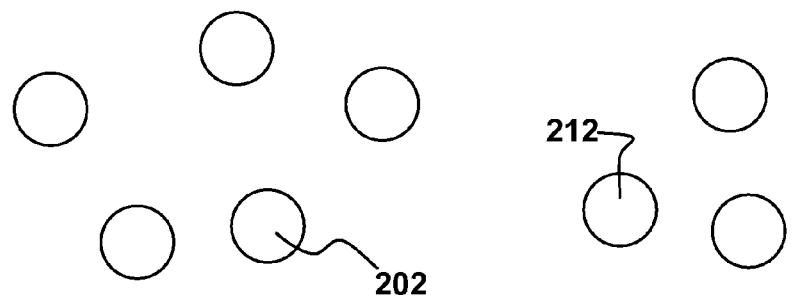
FIGS. 2A-2C are a sequence schematic diagrams illustrating formation of coated nanoparticles for a paint, ink, or paste for use in forming an absorber layer of a photovoltaic device according to an alternative embodiment of the present invention.
Figure 2B:
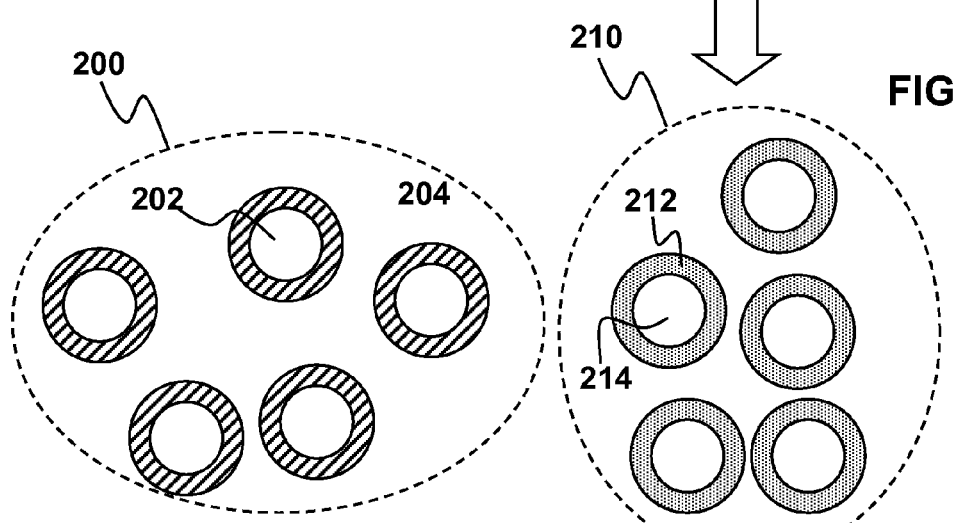
Figure 2C:
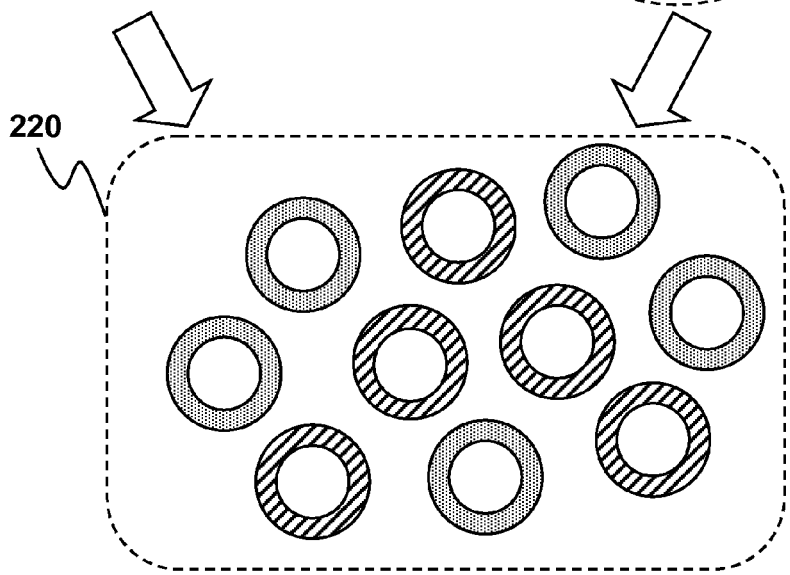

In an alternative embodiment, depicted in FIGS. 2A-2C, core nanoparticles may be divided into two portions as shown in FIG. 2A. As shown in FIG. 2B, first portion 200 core nanoparticles 202 are coated with a layer 204 of indium. In a second portion 210 core nanoparticles 212 are coated with Ga. The two portions may then be mixed together to form a mixture 220 as shown in FIG. 2C for use in an ink, paint, or paste.

In examples described above, core nanoparticles containing Cu may be coated with a layer of In or Ga or both. if desired, the nanoparticles may be further coated with additional layers, including one or more layers containing group VIA elements, e.g., Se or S. It should also be understood that group TB, IIIA, and VIA elements other than Cu, In, Ga, Sc, and S may be use in the coated nanoparticles described herein, and that the use of a hyphen ("-" e.g., in Cu—Se or Cu—In—Se) does not indicate a compound, but rather indicates a coexisting mixture of the elements joined by the hyphen. Where several elements can be combined with or substituted for each other, such as In and Ga, or Se, and S, in embodiments of the present invention, it is not uncommon in this art to include in a set of parentheses those elements that can be combined or interchanged, such as (In, Ga) or (Se, S). The descriptions in this specification sometimes use this convenience. Finally, also for convenience, the elements are discussed with their commonly accepted chemical symbols. Group IB elements suitable for use in the method of this invention include copper (Cu), silver (Ag), and gold (Au). Preferably the group IB element is copper (Cu). Group IIIA elements suitable for use in the method of this invention include gallium (Ga), indium (In), aluminum (Al), and thallium (Tl). Preferably the group IIIA element is gallium (Ga) and/or aluminum (Al) and/or indium (In). Group VIA elements of interest include selenium (Se), sulfur (S), and tellurium (Te), and preferably the group VIA element is either Sc or S, or both Se and S.

Coating of Nanoparticles

There are a number of different ways of coating the nanoparticles. By way of example, the core nanoparticles (e.g., copper) may be placed in an indium-containing or gallium-containing or aluminum-containing chemical bath for defined period of time. The chemical bath can be cooled to prevent melting of the indium or gallium during coating, or heated to cause the controlled decomposition of heat-sensitive precursor materials. Alternatively, the core nanoparticles may be coated by atomic layer deposition (ALD). The metal layers can be deposited in a fairly conformal, nearly uniform fashion through either chemical bath deposition, electroless plating, or atomic layer deposition, or combinations of these and/or similar techniques, with the first two deposition methods typically taking place in a liquid environment, and the last deposition technique typically taking place in a gas environment.

For chemical bath deposition onto copper nanoparticles, the thickness of the indium or gallium layer is set by the particle residence time in the chemical bath. For atomic layer deposition, the thickness of the coating layer is set by a range of variables including but not limited to the total number of deposition cycles and the substrate temperature.

By way of example and without loss of generality, Cu or Cu/Ga nanopowders can be dispersed in an aqueous solution and then coated with indium and/or gallium and/or aluminum metal using one of the following electroless plating processes.

1. Alkaline Indium Electroless Plating Bath

In a first example an electroless indium plating bath under alkaline or weakly alkaline conditions may contain hydrazine or sodium borohydride as a reducing agent. An aqueous solution of Indium salts may be prepared with Indium salts can be Indium (I) sulfate, Indium(III) sulfate, Indium (I) nitrate, Indium(III) nitrate, Indium (I) chloride, Indium(III) chloride, Indium (I) Iodide, Indium(III) iodide, Indium (I) trifiate (trifluoromethanesulfonate), Indium(III) trif7ate (trifluoronlethanesulfonate), Indium (I) acetate, or Indium(III) acetate at a concentration of 1 to 30 mM, preferably 5 to 10 mM. Water used in the plating bath is distilled and deionized with a resistance more than 1 Mega Ohms, preferably more than 10 Mega Ohms. Chelatinb, capping, complexing agents or stabilizers Such as sodium citrate or potassium citrate or nitrilotriacetic acid, trlsodium salt, or ethylenediaminetetraacetic acid, disodium salt, trictha.nol'.mine, pyridine, polyvinylpyrilidinol (PVP), trioctylamines, TOAB, and/or similar compounds may be added into the above indium salt solution. The concentration of the chelating agents or surfactants may range from 10 to 100 mM, preferably from 20 to 60 mM. A reducing agent, (such as hydrazine or sodium born-hydride) is slowly added into the mixture and the final concentration of the reducing agent may range from 20 to 200 mM, preferably from 50 to 100 mM. The pH value for the final solution is adjusted to between 8 and 12, preferably in the range of 9 to 11. The temperature of the plating bath is raised to between 30° C. and 90° C., preferably between 40° C. and 60° C. Precise control of the ramping rate and the final temperature allow for precise control of the deposition rate of indium. In addition to temperature, the pH value, concentration of indium in the solution, and the plating time also determine the final thickness of the indium layer that is deposited. The plating time may vary from 10 to 300 minutes. The thickness of the indium layer also depends on the particle size of the copper nanopowders. For copper or copper-gallium nanopowders with an average particle size of 20 nm, the indium layer may be made to the range of 10 to 50 nm. The thickness of the indium layer is related to the residence time of the nanoparticles in the chemical bath. The suspension of coated Cu or Cu/Ga nanoparticles can be directly used as coating media for a CIGS absorber layer, or coated with a second and/or a third shell layer of Al and/or Ga and/or In as described herein, then used as a coating media for a solar cell absorber layer. Alternatively, the suspension can be diluted or concentrated to form a nanoparticle ink, paint, or paste formulation with a desired viscosity and/or dispersivity. Techniques such as centrifugation and filtration can also be used to collect coated nanoparticles, either singly or in combination. Then the coated nanoparticles can be redispersed in a dispersion/suspension system to form an ink, paint or paste.

2. Acidic Indium Electroless Plating Bath

In a second example an acidic indium electroless plating bath may include indium salts and thiourea in an aqueous solution with a low pH value. Chelating agents may be used to stabilize indium ions if necessary for a conformal coating on copper nanopowders. Unlike alkaline indium electroless plating, a reducing agent is not required. Indium salts can be Indium (I) sulfate, Indium(III) sulfate, Indium (I) nitrate, Indium(III) nitrate, Indium (I) chloride, Indium(III) chloride, Indium (I) Iodide, Indium(III) iodide, Indium (I) triflate (trifluoromethanesulfonate), Indium(III) triflate (trifluoromethanesulfonate), Indium (I) acetate, or Indium(M) acetate. The concentration of the indium salts may range from about 5 to about 200 mM, preferably from about 50 to about 150 mM. The concentration of thiourea may range from about 0.5 to about 2 M, preferably from about 0.8 to about 1.2 M. The pH value can be adjusted to between about 0 to about 5, preferably between about 0 and about 2. Inorganic or organic acids can be used to control the pH value of the plating bath. Suitable acids include sulfuric acid, nitric acid, hydrochloric acid, phosphoric acid, acetic acid, nitrilotriacetic acid, oxalic acid, and formic acid. Suitable chelating agents include citric acid, nitrilotriacetic acid, acetylacetone (acac), ethylenediaminetetraacetic acid (EDTA), alkylamine acetic acid, tartaric acid, polyaciylic acid, polyvinylpyrilidinol (PVP), trioctylamines, TOAB, polyvinyl alcohol (PVA), and/or similar compounds. The temperature of the plating bath may be between 30° C. and 90° C., preferably between 40° C. and 60° C.

An indium electroless plating bath at low pH may be prepared as follows. To an aqueous solution of Indium chloride 100 mM and thiourea 1 M hydrochloric acid is added. The pH may be adjusted around pH=1. The temperature of the solution is raised to about 50° C. The whole plating time may range from 5 to 120 minutes depending on the desired thickness of Indium layer over copper nanoparticles.

Excess indium salts may be minimized by control of the starting indium salt concentration so that only enough indium is needed for certain thickness of indium coating. If a fast deposition rate is required in the plating process, excess indium salt in an indium plating bath might not be avoidable. In this case, an ultrafiltration technique can be used to separate Cu/In nanoparticles from the In salt solution. The suspension of Cu/In nanoparticles can be directly used as coating media for a CIGS absorber layer, or coated with a second and/or a third shell layer of Al and/or Ga as described below, then used as a coating media for a solar cell absorber layer. Alternatively, the suspension can be diluted or concentrated to form a nanoparticle ink, paint, or paste formulation with a desired viscosity and/or dispersivity. Techniques such as centrifugation and filtration can also be used to collect coated nanoparticles, either singly or in combination. Then the coated nanoparticles can be redispersed in a dispersion/suspension system to form an ink, paint or paste.

3. Alkaline Aluminum Electroless Plating Bath

In a third example an electroless aluminum plating bath under alkaline or weakly alkaline conditions may contain hydrazine or sodium borohydride as a reducing agent. An aqueous solution of aluminum salts may be prepared with aluminum salts that can be aluminum (I) sulfate, aluminum (III) sulfate, aluminum (I) nitrate, aluminum (III) nitrate, aluminum (I) chloride, aluminum (III) chloride, aluminum (I) Iodide, aluminum (III) iodide, aluminum (I) triflate (trifluoromethanesulfonate), aluminum (III) triflate (trifluoromethanesulfonate), aluminum (I) acetate, or aluminum (III) acetate, and/or similar compounds, at a concentration of 1 to 30 mM, preferably 5 to 10 nM. Water used in the plating bath is distilled and deionized with a resistance more than 1 Mega Ohms, preferably more than 10 Mega Ohms. Chelating, capping, complexing agents or stabilizers such as sodium citrate or potassium citrate or nitrilotriacetic acid, trisodium salt, or ethylenediaminetetraacetic acid, disodium salt, triethanol amine, pyridine, polyvinylpyrilidinol (PVP), trioctylamines, TOAB, and/or similar compounds may be added into the above indium salt solution. The concentration of the chelating agents or surfactants may range from 10 to 100 mM, preferably from 20 to 60 nM. A reducing agent, (such as hydrazine or sodium boro-hydride) is slowly added into the mixture and the final concentration of the reducing agent may range from 20 to 200 nM, preferably from 50 to 100 mM. The pH value for the final solution is adjusted to between 8 and 12, preferably in the range of 9 to 11. The temperature of the plating bath is raised to between 30° C. and 90° C., preferably between 40° C. and 60° C. Precise control of the ramping rate and the final temperature allow for precise control of the deposition rate of indium. In addition to temperature, the pH value, concentration of aluminum in the solution, and the plating time also determine the final thickness of the aluminum layer that is deposited. The plating time may vary from 10 to 300 minutes. The thickness of the aluminum layer also depends on the particle size of the copper or copper-gallium nanopowders. For copper or copper gallium nanopowders with an average particle size of 20 nm, the aluminum layer may be made to the range of 10 to 50 nm. The thickness of the aluminum layer is related to the residence time of the nanoparticles in the chemical bath. The suspension of coated Cu or CuGa nanoparticles can be directly used as coating media for a CIGS absorber layer, or coated with a second and/or a third shell layer of In and/or Ga and/or Al as described herein, then used as a coating media for a solar cell absorber layer. Alternatively, the suspension can be diluted or concentrated to form a nanoparticle ink, paint, or paste formulation with a desired viscosity and/or dispersivity. Techniques such as centrifugation and filtration can also be used to collect coated nanoparticles, either singly or in combination. Then the coated nanoparticles can be redispersed in a dispersion/suspension system to form an ink, paint or paste.

4. Acidic Aluminum Electroless Plating Bath

In a fourth example an acidic aluminum electroless plating bath may include aluminum salts and thiourea in an aqueous solution with a low pH value. Chelating agents may be used to stabilize aluminum ions if necessary for a conformal coating on copper nanopowders. Unlike alkaline aluminum electroless plating, a reducing agent is not required. Aluminum salts can be aluminum (I) sulfate, aluminum (III) sulfate, aluminum (I) nitrate, aluminum (III) nitrate, aluminum (I) chloride, aluminum (III) chloride, aluminum (I) Iodide, aluminum (III) iodide, aluminum (I) triflate (trifluoromethanesulfonate), aluminum (III) triflate (trifluoromethanesulfonate), aluminum (I) acetate, or aluminum (III) acetate, and/or similar compounds. The concentration of the indium salts may range from about 5 to about 200 mM, preferably from about 50 to about 150 mM. The concentration of thiourea may range from about 0.5 to about 2 M, preferably from about 0.8 to about 1.2 M. The pH value can be adjusted to between about 0 to about 5, preferably between about 0 and about 2. Inorganic or organic acids can be used to control the pH value of the plating bath. Suitable acids include sulfuric acid, nitric acid, hydrochloric acid, phosphoric acid, acetic acid, nitrilotriacetic acid, oxalic acid, and formic acid. Suitable chelating agents include citric acid, nitrilotriacetic acid, acetylacetone (acac), ethylenediaminetetraacetic acid (EDTA), alkylamine acetic acid, tartaric acid, polyacrylic acid, polyvinylpyrilidinol (PVP), trioctylamines, TOAB, polyvinyl alcohol (PVA), and/or similar compounds. The temperature of the plating bath may be between 30° C. and 90° C., preferably between 40° C. and 60° C.

An aluminum electroless plating bath at low pH may be prepared as follows. To an aqueous solution of aluminum chloride 100 mM and thiourea 1 M hydrochloric acid is added. The pH may be adjusted around pH=1. The temperature of the solution is raised to about 50° C. The whole plating time may range from 5 to 120 minutes depending on the desired thickness of aluminum layer over copper nanoparticles.

Excess aluminum salts may be minimized by control of the starting aluminum salt concentration so that only enough aluminum is needed for a certain thickness of aluminum coating. If a fast deposition rate is required in the plating process, excess aluminum salt in an aluminum plating bath might not be avoidable. In this case, an ultrafiltration technique can be used to separate Cu/Al nanoparticles from the Al salt solution. The suspension of Cu/Al nanoparticles can be directly used as coating media for a CIAS absorber layer, or coated with a second and/or a third shell layer of In and/or Ga as described above, then directly used as a coating media for the absorber layer of a solar cell. Alternatively, the suspension can be diluted or concentrated to form a nanoparticle ink, paint, or paste formulation with a desired viscosity and/or dispersivity. Techniques such as centrifugation and filtration can also be used to collect coated nanoparticles, either singly or in combination. Then the coated nanoparticles can be redispersed in a dispersion/suspension system to form an ink, paint or paste.

5. Organometallic Synthesis Using-Metalocenes

In a fifth example, copper (and/or copper gallium, and/or or gallium, and/or any combination thereof) nanoparticles can be coated with a shell of indium (and/or gallium, and/or aluminum) by reacting with organometallic compounds such as metalocenes (e.g. Indium(I)cyclopentadienyl (InCp).

In the prior art, pure indium particles have been made by 'homogenous nucleation of particles through the dissolving InCp in toluene and then adding methanol to initiate homogeneous growth. The prior art has also taught that monodispersed metal nanoparticles can be formed by dispersing gold nanoparticles (e.g., 1-100 nm in diameter) in toluene containing InCp. By avoiding the addition of methanol to this mixture, homogenous nucleation can be suppressed. Instead heterogeneous nucleation (e.g. for the gold particles) dominates, creating very monodispersed indium particles with gold in the center of each particle (Yu, H., Gibbons, P. C., Kelton, K. F., and W. F. Buhro. 2001. Heterogeneous Seeded Growth: A Potentially General Synthesis of Monodisperse Metallic Nanoparticles. J. Am. Chem. Soc. 123: 91989199).

Alternatively, organic nanoparticles between about 1 nm and about 100 nm in diameter may be used in lieu of gold nanoparticles to nucleate growth, the approach taken by Yu et. al. (2001) can be adapted to form coated CIG, CIA, CIGA, and/or other similar nanoparticles for use as the active absorber layer of a solar cell. Alternatively, already existing nanoparticle can be coated with indium (and/or Ga and/or Cu and/or Al) in this way to form nanoparticles of a desired elemental stoichiometry. Organic nanoparticles may be formed by making micelles with a surfactant. At a particular concentration of surfactant, one can obtain spheroids of a desired diameter. Organic nanoparticles may alternatively be obtained commercially and then coated as described above to form the core nanoparticles. For example, 40 nm diameter polystyrene beads are available from Polysciences Incorporated of Warrington, Pa. In addition, 20-nm diameter polystyrene beads are available from Duke Sciences of Palo Alto, Calif. The organic material in the core nanoparticle, e.g., polystyrene may be removed by burning out during annealing of the film to form the absorber layer.

Alternatively, known CVD precursors such as CuCl, copper iodide, or other copper halides, copper diketonates (e.g. Cu(II)-2,2,6,6,-tetramethyl-3,5,-heptanedionate (Cu(thd)2)), Cu (1.1)2,4-pentanedionate, Cu(II) hexafluoroacetylacetonate (Cu(hfac)2), CU(II) acetylacetonate (Cu(acac)4, Cu(II) dimethylaminoethoxide, copper ketoesters, other organocopper or organometallic precursors (for example containing Si or Ge)), and/or Cu(OCH(Me)CH?NMe2)), and combinations or mixtures of the above (see J. Phys. IV 2001, 11, 569.) and a gallium precursor material such as GaCl and/or GaCp can be combined to form CuGa nanoparticles.

6. Atomic Layer Deposition (ALD)

Figure 3:
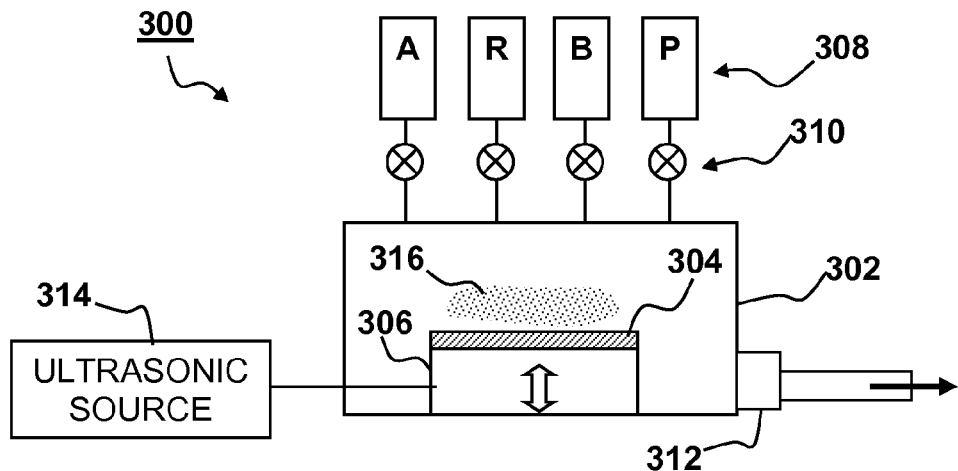
FIG. 3 is a cross-sectional schematic diagram illustrating an apparatus for coating nanoparticles by atomic layer deposition according to an embodiment of the present invention.

FIG. 3 illustrates a typical ALD system 300. The system generally includes a chamber 302 where a substrate 304 rests on a support 306. Gas sources 308 are selectively coupled to the chamber 302 through valves 310. Gases may be removed from the chamber 302 by an exhaust system 312. The gas sources 308 typically supply one or more precursor gases A, B, one or more additional reactants R and a purge gas P (typically inert gas, e.g., nitrogen, argon, helium). A suitable heat source, e.g., one or more infrared lamps, (not shown) adjusts the temperature of the chamber 302 and nanoparticles during ALD.

A typical ALD process involves a sequence Of two different and alternating surface reactions involving two different gaseous reactants. The first reaction exposes the substrate to a pulse of a precursor gas containing molecules or atoms of interest that are to be deposited. Upon application of a pulse of precursor gas, the entire surface within the ALD chamber becomes saturated with chemisorbed molecules of the precursor gas. The atoms of interest attach the precursor gas molecules to deposition sites on the substrate surface. The second reaction exposes the substrate and attached precursor gas molecules to a pulse of second gas, typically a reducing agent, such as hydrogen, which reacts with the attached precursor gas molecules and removes undesired components of the precursor gas leaving the atoms of interest attached to the surface at the deposition sites.

The ALD system is typically purged of reactant gases in between these reactions with a non-reactive purge gas, such as argon or nitrogen, which serve to remove excess chemical species and by-products from the reaction chamber. The separate and pulsed application of the second precursor gas followed by the purge with non-reactive gas ensures that no gas-phase reactions take place in the gas-phase. Rather, chemical reactions occur on exposed surfaces within the ALD reaction chamber. The preceding sequence may be repeated with the original precursor gas or with a different precursor gas. Such a technique may readily be applied to formation of GIGS absorber layers.

ALD thus permits a IB-IIIA-VIA absorber layer (e.g., a CIGS layer) to be built up layer-bylayer, using stepwise deposition of partial atomic monolayers during each application cycle, with the aggregate growth rate directly proportional to the number of reaction cycles rather than the pressure or concentration of precursor gases in the chamber. ALD techniques can thus deposit thin films on the core nanoparticles one atomic layer at a time, in a "digital" fashion. Such "digital" build-up of material greatly simplifies thickness control. Thus, coating thickness, and stoichiometric ratios for the coated nanoparticles, may be carefully controlled using ALD.

To coat nanoparticles by ALD it is often desirable to fluidize the particles, i.e., to agitate them in some way so that they are intermittently suspended above the surface within the chamber 302, during which time all the surface area of the suspended particle is accessible for surface-reactions. According to a particular embodiment of the invention, the support 306 includes a vibration mechanism, e.g., a piezoelectric crystal coupled to an ultrasonic source 314. Nanoparticles 316 are placed on the substrate 304 (or more typically on an electrode layer (e.g., molybdenum) formed on the substrate 304. The ultrasonic source then causes the support 306 to vibrate propelling the nanoparticles 316 upward. By appropriate adjustment of the frequency, amplitude and duty cycle of the signal from the ultrasonic source 314, the nanoparticles 316 may be effectively fluidized for coating by ALD.

The proper choice of precursor materials A, B is important for the ALD process to proceed effectively. Appropriate materials typically exhibit the following features: (I) sufficient volatility at the reaction temperatures, thermal stability with minimal or no self-decomposition, significant reactivity with the second precursor (reducing agent), and substantial insolubility of both precursors in both the product film and the underlying substrate. Limited solubility can however be tolerated if the out-diffusion of a precursor material is rapid enough to go to completion during a short purging period. Limited thermal stability can also be tolerated if the temperature ranges for the deposition processes are well controlled.

For copper, suitable precursors include but are not limited to Cu(I) and Cu(II) compounds such as CuCl, copper iodide, or other copper halides, copper diketonates (e.g. Cu(II)-2,2,6,6,-tetramethyl-3,5,-heptanedionate (Cu(thd)$_2$)), Cu (II) 2,4-pentanedionate, Cu(II) hexafluoroacetylacetonate (Cu(hfac)$_2$), Cu(II) acetylacetonate (Cu(acac)$_2$), Cu(II) dimethylaminoethoxide, copper ketoesters, other organocopper or organometallic precursors (for example containing Si or Ge)), and combinations or mixtures of the above.

For indium, suitable precursors include but are not limited to indium chloride, indium iodide, or other indium halides, dimethylindium chloride, trimethylindium, indium (III) 2,4-pentanedionate (indium acetylacetonate), indium hexafluoropentanedionate, indium methoxyethoxide, indium methyl (trimethylacetyl)acetate, indium trifluoropentanedionate, and other organoindium (e.g., indium-containing beta-diketonates) or organometallic precursors (for example containing Si or Ge), and combinations or mixtures of the above.

For gallium, suitable precursors inciude but are not limited to diethylgallium chloride, gallium triiodide, or gallium (I) halides such as gallium chloride, gallium fluoride, or gallium iodide, gallium acetate, Ga (III) 2,4-pentanedion ate, Ga (III) ethoxide, Ga(III) 2,2,6,6-tetramethylheptanedionate, tris (dimethylaminogallium), and other organogallium (e.g., gallium-containing beta-diketonates) or organometal lie precursors (for example containing Si or Ge), and combinations or mixtures of the above. For Ga(III)-based organometallic precursors, the reaction conditions required for proper surface reactions in the ALD chamber are likely to be substantially harsher than those required for a Ga(I)-based organometallic precursor.

For aluminum, Suitable precursors include but are not limited to aluminum chloride, aluminum iodide, or other halides, dimethylaluminum chloride, aluminum butoxides, aluminum di-s-butoxide ethylacetoacetate, aluminum diisopropoxide ethylacetoacetate, aluminum ethoxide, aluminum isopropoxide, aluminum hexafluoropentanedionate, Al(III) 2,4,-pentanedionate, Al(III) 2,2,6,6-tetramethyl-3,5-heptanedion ate, aluminum trifluoroacetate, trisisobutylaluminum, aluminum silicate, and other organoindium or organometallic precursors (for example containing Si or Ge), and combinations or mixtures of the above.

ALD-based synthesis of coated nanoparticles may also (optionally) use a metal organic precursor containing selenium such as dimethyl selenide, dimethyl diselenide, or diethyl diselenide or a sulfur-containing metal organic precursor, or $H_2Se$ or $H_2S$, or other selenium- or sulfur-containing compounds, and combinations or mixtures of the above.

To react any of the above precursor materials on the substrate surface, ALD reactions require an additional reactant R, often a reducing agent or proton-donor compound. This reactant can be introduced concurrently with the first (Precursor) reactant (especially if the compounds do not cross-react prior to interacting with one another at the substrate surface), or the additional reactant R can be introduced subsequent to the introduction of the initial precursor. When an organometallic precursor is hydrated, a proton-donor compound may not be necessary.

Reducing/proton-donating compounds include but are not limited to hydrogen, water ($H_2O$), methanol, ethanol, isopropyl alcohol, butyl alcohols, and other alcohols, and combinations or mixtures of these materials, as well as carbon monoxide (CO). Oxygen gas ($O_2$) may also be used as the additional reactant, or a mixture of $H_2O$ and $H_2O_2$. For certain precursors, especially hexafluoro-pentanedionate (HFPD) precursors such as copper (II) hexafluoropentanedionate, indium hexafluoro-pentanedionate, and gallium hexafluoropentanedionate, formalin (37% formaldehyde, and 15% methanol in distilled deionized water) is often used as the reducing agent while nitrogen gas ($N_2$) is used as the purge gas.

In some situations, a seed layer, e.g., of platinum or palladium may be deposited on the substrate before ALD with these precursors.

During the deposition process, a typical ALD cycle consists of 1-2 seconds of a first metal organic precursor pulse, followed by a 1-2 second purge, 1-2 seconds of a reducing agent (or other reactant) pulse, followed by a 1-2 second purge. In general, the duration of the pulse and/or purge cycles may range from about 0.001 seconds to about 60 seconds, more preferably from about 0.01 to about 20 seconds, and most preferably from about 0.1 to about 10 seconds. The pulse sequence may be repeated any number of times to produce the desired thickness of metal layer on the core nanoparticles. Subsequent pulse sequences with precursors of different metals can build up multiple layer coatings in a controlled fashion.

7. Combinations and Extensions of the Above Techniques

Further, the above techniques can be combined in various ways (e.g., electroexplosion of CuGa wires to make Copper-gallium nanoparticles, followed by wet chemical techniques to coat indium and/or gallium and/or aluminum and/or copper onto such nanoparticles, followed by selenium exposure and/or ALD using selenium precursors to coat a selenium layer onto the nanoparticles.

Furthermore, a 1 to 100 nm organic nanoparticle can be coated optionally with Cu, and/or Ga, and/or In, and/or Se, where the organic core is used as a highly monodispersed seed particle. Coating of such organic core particles can be done with any of the dry and/or wet chemical techniques described above.

Forming an Absorber Layer

Figure 4:
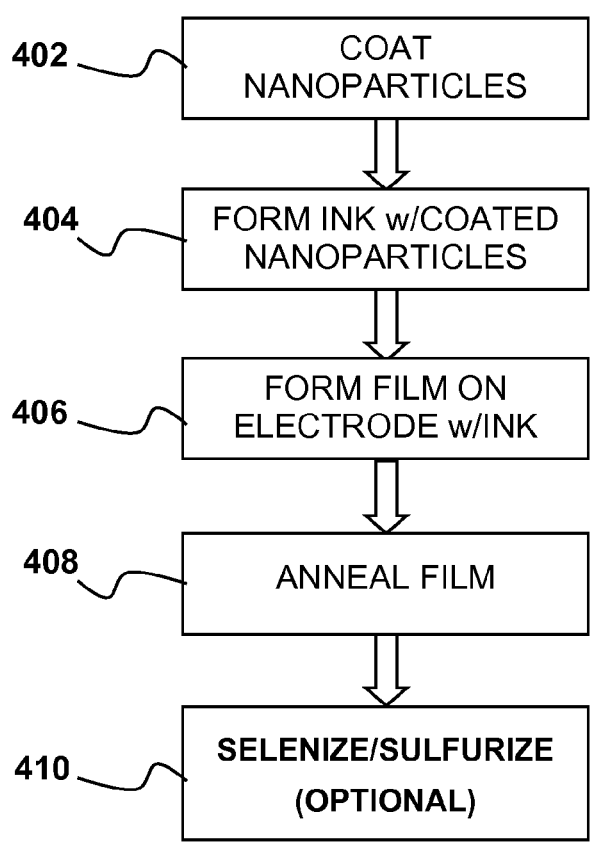
FIG. 4 is a flow diagram illustrating the fabrication of a photovoltaic device according to an embodiment of the present invention.

The flow diagram of FIG. 4 illustrates an example of a method for forming an absorber layer for a photovoltaic device using coated nanoparticles. The method begins at step 402 by coating core nanoparticles with one or more layers of metal from group TB, IIIA or VIA in a controlled fashion such that the resulting coated nanoparticles have a desired stoichiometric ratio of elements and appropriate crystal phase as described above.

At step 404 an ink is formed with the nanoparticles. Generally, an ink may be formed by dispersing the nanoparticles in a dispersant (e.g., a surfactant or polymer) along with (optionally) some combination of other components commonly used in making inks. Other components include, without limitation, binders, emulsifiers, anti-foaming agents, dryers, solvents, fillers, extenders, thickening agents, film conditioners, anti-oxidants, flow and leveling agents, plasticizers and preservatives.

If particle surfaces attract one another, then flocculation can occur, resulting in aggregation and decreasing dispersion. If particle surface repel one another, then stabilization can occur, where fine particles do not aggregate and tend not to settle out of solution. Dispersants prevent ultrafine flocculating particles from reaggregating. Classes of dispersants include but are not limited to surfactants and polymers. Surfactants are surface-active agents that lower the surface tension of the solvent in which they dissolve. In addition to their role as stabilizers, they also serve as wetting agents, keeping the surface tension of a medium low so that the ink interacts with the substrate. Surfactants are molecules that contain both a hydrophobic carbon chain and a hydrophilic polar group. The polar group can be non-ionic. If the polar group is ionic, the charge can be either positive or negative, resulting in cationic or anionic surfactants. Zwitterionic surfactants contain both positive and negative charges within the same molecule; one example is N-n-Dodecyl-N,N-diemthyl betaine. Surfactants are often used as dispersant agents for aqueous solutions, especially When the surfactant concentration is above the critical micelle concentration (CMC).

Polymers are naturally occurring or synthetic chains consisting of large molecules made up of a linked series of repeated simple monomers. Both the chemical and physical nature of the monomer (size, shape, atomic constituents, polarity, and the like) and the number of linked monomers (e.g. number of monomer repeats, leading to changes in polymer molecular weight) change the polymer properties. Polymers are often used as dispersant agents for pigments suspended in organic solvents.

Foam can form from the release of various gases during ink synthesis and from gas introduced during mixing. Surfactants adsorb on the liquid-air interface and stabilize it, accelerating foam formation. Anti-foaming agents prevent foaming from being initiated, while defoaming agents minimize of eliminate previously-formed foam. Anti-foaming agents include hydrophobic solids, fatty oils, and certain surfactants, all of which penetrate the liquid-air interface to slow foam formation. Anti-foaming agents include both silicone and silicone-free materials. silicone-free materials include microcrystalline wax, mineral oil, polymeric materials, and silica- and surfactant-based materials.

Binders and/or resins are used to hold together pigment particles. Examples of typical binders and/or include acrylic monomers (both as monofunctional diluents and multifunctional reactive agents), acrylic resins (e.g. acrylic polyol, amine synergists, epoxy acrylics, polyester acrylics, polyether acrylics, styrene/acrylics, urethane acrylics, or vinyl acrylics), alkyd resins (e.g. long-oil, medium-oil, short-oil, or tall oil), adhesion promoters such as polyvinyl pyrrolidone (PVP), amide resins, amino resins (such as melamine-based or urea-based compounds), asphalt/bitumen, butadiene acrylonitriles, cellulosic resins (such as cellulose acetate butyrate (CAB)), cellulose acetate proprionate (CAP), ethyl cellulose (EC), nitrocellulose (NC), or organic cellulose ester), chlorinated rubber, dimer fatty acids, epoxy resin (e.g. acrylates, bisphenol A-based resins, epoxy UV curing resins, esters, phenol and cresol (Novolacs), or phenoxy-based compounds), ethylene co-terpolymers such as ethylene acrylic/methacrylic Acid, -E/AA, E/M/AA or ethylene vinyl acetate (EVA), fluoropolymers, gelatin (e.g. Pluronic F-68), glycol monomers, hydrocarbon resins (e.g. aliphatic, aromatic, or coumarone-based such as indene), maclic resins, modified urea, natural rubber, natural resins and gums, rosins, modified phenolic resins, resols, polyamide-polybutadienes (liquid hydroxyl-terminated), polyesters (both saturated and unsaturated), polyolefins, polyurethane (PU) isocynates (e.g. hexamethylene diisocynate (HDI), isophorone diisocyanate cycloaliphatics, diphenylmethane disiocyanate (MDI), toluene diisocynate (TDI), or trimethylhexamethylene diisocynate (TIVID1)), polyurethane (PU) polyols (e.g. caprolactonc, dimer-based polyesters, polyester, or polyether), polyurethane (PU) dispersions (PUDs) such those based on polyesters or polyethers, polyurethane prepolymers (e.g. caprolactone, dimerbased polyesters, polyesters, polyethers, and compounds based on urethane acrylate), Polyurethane thermoplastics (TPU) such as polyester or polyether, silicates (e.g. alkyl-silicates or water-glass based compounds), silicones (amine functional, epoxy functional, ethoxy functional, hydroxyl functional, methoxy functional, silanol functional, or cinyl functional), styrenes (e.g. styrene-butadiene emulsions, and styrene/vinyl toluene polymers and copolymers), or vinyl compounds (e.g. polyolefins and polyolefin derivatives, polystyrene and styrene copolymers, or polyvinyl acetate (PVAC)).

Emulsifiers are agents that blend liquids with other liquids by promoting the breakup of aggregating materials into small particles and therefore stabilize their suspension in solution. Examples of emulsifiers are sorbitan esters such as sorbitan sesquioleate (Arlacel 60), sorbitan sesquioleate (Arlacel 83), sorbitan monolaurate (Span 20), sorbitan monopalmitate (Span 40), sorbitan monostcarate (Span 60), sorbitan tristearate (Span 65), sorbitan monooleate (Span 80), and sorbitan triolcate (Span 85).

Polymeric emulsifiers include polyoxyethylene monostearate (Mytj 45), polyoxyethylene monostearate (Myt j 49), polyoxyl 40 stearate (Mytj 52), polyoxyethylene monolaurate (PEG 400), polyoxyethylene monooleate (PEG 400 monolcatc) and polyoxyethylene monostearate (PEG 400 monostearate).

The Tween series of surfactants are polyoxyethylene derivatives of sorbitan-based surfactant compounds like the Span series products. Tween surfactants are hydrophilic, generally soluble or dispersible in water, and soluble in varying degrees in organic liquids. They are used for oil-in-water (0/W) emulsification, dispersion or solubilization of oils, and wetting. Frequently, Tween surfactants are combined with similarly numbered Span surfactants to promote emulsion stability. These materials include polyoxyethylene sorbitan monolaurate (Tween 20), polyoxyethylene sorbitan monolaurate (Tween 21), polyoxyethylene sorbitan monopalmitate (Tween 40), polyoxyethylene sorbitan monostearate (Tween 60), polyoxyethylene sorbitan tristearate (Tween 61), polyoxyethylene sorbitan mono-oleate (Tween 80), polyoxyethylene sorbitan monooleate (Tween 8 1), and polyoxyethylene sorbitan tri-olcate (Tween 85). Myij, Arlacel, Tween and Span are registered trademarks of ICI Americas, Inc., of Wilmington, Del.

Solvents can be aqueous (water-based) or non-aqueous (organic). While environmentally friendly, water-based solutions carry the disadvantage of a relatively higher surface tension than organic solvents, making it more difficult to wet substrates, especially plastic substrates. To improve substrate wetting with polymer substrates, surfactants are added to lower the ink surface tension (while minimizing surfactant-stabilized foaming), while the substrate surfaces are modified to enhance their surface energy (e.g. by corona treatment).

Typical organic solvents include acetate, acrylates, alcohols (butyl, ethyl, isopropyl, or methyl), aldehydes, benzene, dibromomethane, chloroform, dichloromethane, dichloroethane, trichloroethane, cyclic compounds (e.g. cyclopentanone or cyclohexanone), esters (e.g. butyl acetate or ethyl acetate), ethers, glycols (such as ethylene glycol or propylene glycol) hexane, heptane, aliphatic hydrocarbons, aromatic hydrocarbons, ketones (e.g. acetone, methyl ethyl ketone, or methyl isobutyl ketone), natural oils, terpenes, terpinol, and/or toluene.

Thickening agents are used to tune and optimize ink viscosity to match the requirements of a particular printing process. Thickening agents modify the theological properties of the ink (Rheology is the study of the relationship between an applied stress and the resulting deformation arising from that stress). Examples of theological behavior include pseudoplasticity, where an ink becomes runnier when stirred or spread, and non-newtonian behavior, where ink viscosity changes when the ink is stirred. The greatest contribution to viscosity of any dispersion consisting primarily of a binder (resin), solvent(s) and pigment is due to the particular nature of the pigment. Its particle size is also an important contributing factor. Usually, the larger the particle size, the lower the surface area and the surface energy, and the less likely are primary particles to form new assemblies. Consequently, they show lower viscosity and increased flow relative to their small particle size counterparts. Rheology Modifiers/thickeners can be associative (where the modifier strongly interacts with other ink particles), such as hydrophobically modified alkali-soluble emulsions (HASE), 'hydrophobically modified cellulose (HM EC), hydrophobically modified ethoxylate urethane (HEUR), styrene maleic annhydride copolymer (SMAc), and carboxylic and polycarboxylic acids. Rheology modifiers can also be non-associative, where the modifier does not interact strongly with other ink components. Exampled of non-associative modifiers include cellulosic materials, such as carboxymethylcelluose (CMC), hydroxyethylcellulose (H EC), methylcellulose (methocel, or MC), methyl hydroxychtyl cellulose (MHEC), and methyl hydroxypropyl cellulose (MHPC). Additional examples of typical thickness modifiers include colloidal silicas, metal organic gellants (e.g. based on either aluminate, titanate, or zirconate), natural gums (e.g. alginate, carrageean, guar, and/or xanthan gums), organoclays (e.g. attapulgite, bentonite, hectorite, and montmorrillonitc), organowax (such as castor oil derivatives (HCO-Wax) and/or polyamide-based organowax), polysaccharide derivatives, and starch derivatives. Viscosity depressants can also be added to decrease ink viscosity.

Other thickening agents include mixtures of polymers of various molecular weights ("low-solids", or inks containing relatively little solid matter). These more traditional thickening agents (such as nitrocellulose polymers) required large amounts of solvent to dissolve High MW polymers. Modern thickening agents include "high-solid" polymers, such as polyacrylate homopolymers and copolymers, where both monomeric and oligomeric polymeric precursors can be polymerized in situ after ink deposition, for example upon exposure to UV light or other energy sources. Polyactylates are especially useful for water-based inks. In situ polymerization typically requires initiators that produce radicals when exposed to energy that initiate the polymerization process. Examples of initiators include amine-based photoinitiator and cross-linking/coupling agents such as acetoacetates, amides, amines (including aminoplasts, benzoguanamine, melamine-formaldehyde, and ureaformaledhyde), annhydrides, aziridines, carbodiimides, diisocynates, mercapto compounds, silanes, and titanate coupling agents. titanate coupling agents include isopropyl diolcic(dioctylphosphate) titanate (NDZ-101), isopropyl tri(dioctyl)phosphato titanate (NDZ-102), isopropyl trioleoyl titanate (N DZ-105), isopropyl tri(dodecyl)benzenesulfonyl titanate (NDZ-109), isopropyl tristearoyl titanate (NDZ-130), isopropyl tri(dioctyl)pyrophosphato titanate (NDZ-201), di(dioctyl)pyrophosphato ethylene titanate (NDZ-311), the triethylamine adduct of NDZ-31 1 (NDZ-31 1), tetraisopropyl di(dioctyl)phosphito titanate (NDZ-401), and tetraisopropyl titanate (TPT).

Thickening agents can be used to achieve a particular blocking resistance, where ink adheres only to its intended substrate, by tuning the glass transition temperature of the material.

Antioxidants are used to retard deterioration of coating films caused by oxidation or heat exposure, and are typically based on molecules that will scavenge free radicals as they are formed. A range of antioxidants is available, including materials based on phenolic compounds (e.g. primary and secondary amines, lactone, phenolic compounds, phosphite, phosphonite, thioesters, and stearic acids, as well as chemically-related compounds.

Flow and leveling agents reduce the surface tension under either or both dynamic and static conditions, to obtain an optimal wetting and leveling effect, and to improve the surface flow of the coating. Poor surface flow can induce coating defects such as orange-peel, craters, brush marks, and other surface defects. Examples of typical flow and leveling agents include cellulose acetobutyrate, fluorosurfactants, polyacrylates, silicone, and any of a variety of waxes, including amide wax, bee's wax, carnauba wax, microcrystalline wax, paraffin wax, polyethylene wax, polypropylene wax, and PFTE wax.

Dispersants, binders, emulsifiers, anti-foaming agents, dryers, solvents, fillers, extenders, thickening agents, film conditioners, anti-oxidants, flow and leveling agents, plasticizers and preservatives can be added in various combinations to improve the film quality and optimize the coating properties of a nanoparticulate ink, paste, or paint. The use of these materials in the formulation of a semiconductor ink, paste, or paint is not limited to nanoparticulates formed by the methods described above, but also nanoparticles formed through a wide variety of nanoparticles synthesis techniques, including but not limited to those described, e.g., in Published PCT Application WO 2002/084708 or commonly assigned U.S. patent application Ser. No. 10/782,017, the disclosures of both of which are incorporated herein by reference.

At step 406 a thin film of the ink, paint, or paste is then formed on a substrate (typically having a coating made of a suitable conductive material, such as molybdenum), e.g., by any of a variety of coating methods including but not limited to contact printing, top feed reverse printing, bottom feed reverse printing, nozzle feed reverse printing, gravure printing, microgravure printing, reverse microgravure printing, comma direct printing, roller coating, slot die printing, meiyerba.r coating, lip direct coating, dual lip direct coating, capillary coating, ink hetprinting, jet deposition, spray deposition, and the like. The use of these and related coating and/or printing techniques in the non-vacuum based deposition of a semiconductor ink, paste, or paint is not limited to ink, paste, and/or paints formed from nanoparticulates derived by the methods described above, but also using nanoparticles formed through a wide variety of other nanoparticles synthesis techniques, including but not limited to those described, e.g., in Published PCT Application WO 2002/084708 or commonly assigned U.S. patent application Ser. No. 10/782,017.

A film can be deposited on a flexible substrate, in a roll-to-roll manner (either continuous or segmented) using a commercially available web coating system. At step 408, the thin film is annealed, e.g., by rapid thermal processing at about 200° C. to about 600° C. A group VIA element may be incorporated into the film to form the absorber layer absorber layer. The group VIA element may be incorporated during annealing (e.g., by exposure to a sulfur containing vapor such as FLS, or a selenium containing vapor such as Se vapor or Fl—)Se, or both). Further, the group VIA element may be incorporated into the nanoparticles during steps 402 or 404.

Photovoltaic Devices

Figure 5:
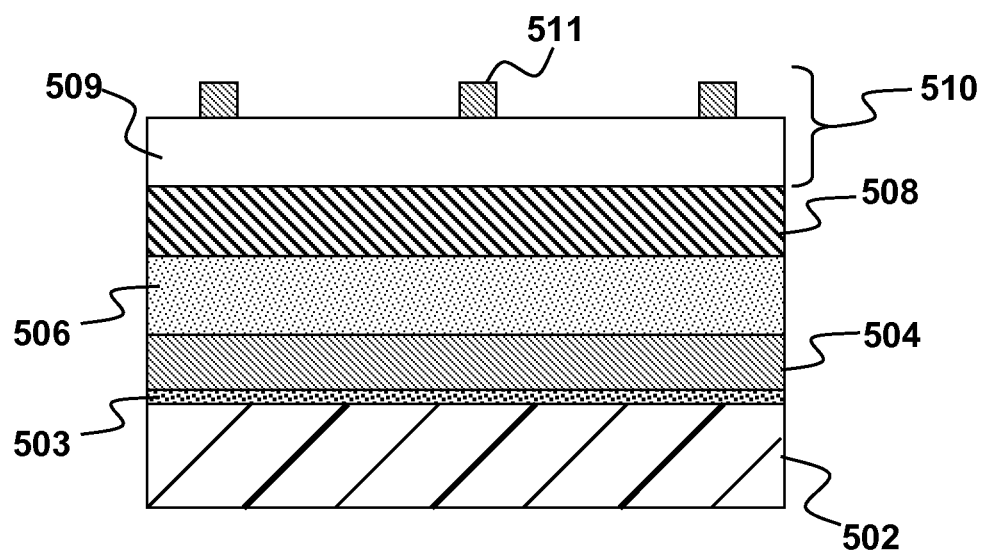
FIG. 5 is a schematic diagram of a photovoltaic cell according to an embodiment of the present invention.

FIG. 5 depicts an example of a photovoltaic cell 500 that uses a combination of 1B-IIIA-VIA materials as components of an absorber layer. The cell 500 generally includes a substrate or base layer 502, a base electrode 504, a IB-IIIA-VIA absorber layer 506, a window layer 508, and a transparent electrode 510. The base layer 502 may be made from a thin flexible material suitable for roll-to-roll processing. By way of example, the base layer may be made of a metal foil, such as titanium, aluminum, stainless steel, molybdenum, or a plastic or polymer, such as polyimides (P1), polyamides, polyetherctherketone (PEEK), Polyethersulfone (PES), polycthcrimide (PEI), polyethylene naphtalate (PEN), Polyester (PET), or a metallized plastic. The base electrode 504 is made of an electrically conducive material. By way of example, the base electrode 504 may be a layer of Al foil, e.g., about 10 microns to about 100 microns thick. An optional interfacial layer 503 may facilitate bonding of the electrode 504 to the substrate 502. The adhesion can be comprised of a variety of materials, including but not limited to chromium, vanadium, tungsten, and glass, or compounds such as nitrides, oxides, and/or carbides.

The absorber layer may be fabricated using coated nanoparticles, e.g., as described above with respect to FIG. 4. By way of example, and without limitation, the absorber layer 506 may include material of the general formula $CuIni_{-}, Gax(S \text{ or } Se)_2$. The absorber layer 506 may be about 0.5 micron to about 5 microns thick after annealing, more preferably from about 0.5 microns to about 2 microns thick after annealing.

The window layer 508 is typically used as a junction partner for the absorber layer 506. By way of example, the bandgap adjustment layer may include cadmium sulfide (CdS), zinc sulfide (ZnS), or zinc selenide (ZnSe) or some combination of two or more of these. Layers of these materials may be deposited, e.g., by chemical bath deposition, to a thickness of about 1 nm to about 500 nm.

The transparent electrode 510 may include a transparent conductive oxide layer 509, e.g., zinc oxide (ZnO) or aluminum doped zinc oxide (ZnO:Al), or Indium Tin Oxide (ITO), either of which can be deposited using any of a variety of means including but not limited to sputtering, evaporation, CBD, electroplating, CVD, PVD, ALD, and the like.

Alternatively, the transparent electrode 510 may include a transparent conductive polymeric layer 509, e.g. a transparent layer of doped PEDOT (Poly-3,4-Ethylenedioxythiophene), which can be deposited using spin, sip, or spray coating, and the like. PSS:PEDOT is a doped conducting polymer based on a heterocyclic thiophene ring bridged by a diether. A water dispersion of PEDOT doped with poly(styrenesulfonate) (PSS) is available from H.C. Starck of Newton, Massachusetts under the trade name of Baytron®P. Baytron® is a registered trademark of Bayer Aktiengesellschaft (hereinafter Bayer) of Leverkusen, Germany. In addition to its conductive properties, PSS:PEDOT can be used as a planarizing layer, which can improve device performance. A potential disadvantage in the use of PEDOT is the acidic character of typical coatings, which may serve as a source through which the PEDOT Chemically may attack, react with, or otherwise degrade the other materials in the solar cell. Removal of acidic components in PEDOT can be carried out by anion exchange procedures. Non-acidic PEDOT can be purchased commercially. Alternatively, similar materials can be purchased from TDA materials of Wheat Ridge, Colo., e.g. Oligotron™ and Aedotron™. The transparent electrode 510 may further include a layer of metal (e.g., Ni Al or Ag) fingers 511 to reduce the overall sheet resistance.

An optional encapsulant layer (not shown) provides environmental resistance, e.g., protection against exposure to water or air. The encapsulant may also absorb UV-light to protect the underlying layers. Examples of suitable encapsulant materials include one or more layers of polymers such as THZ, Tefzell® (DuPont), tefdel, thermoplastics, polyimides (PI), polyamides, polyetheretherketone (PEEK), Polyethersulfone (PES), polyetherimide (PEI), polyethylene naphtalate (PEN), Polyester (PET), nanolaminate composites of plastics and glasses (e.g. barrier films such as those described in commonly-assigned, co-pending U.S. patent application Ser. No. 10/698,988, to Brian Sager and Martin Roscheisen, filed Oct. 31, 25 2003, and entitled "INORGANIC/ORGANIC HYBRID NANOLAMINATE BARRIER FILM", which is incorporated herein by reference), and combinations of the above.

Embodiments of the present invention provide low-cost, highly tunable, reproducible, and rapid synthesis of a nanoparticulate Cu—In and Cu—Ga material for use as an ink, paste, or paint in solution-deposited absorber layers for solar cells. Coating the nanoparticles allows for precisely tuned stoichiometry, and/or phase, and/or size, and/or shape, e.g., for Cu/In or Cu/Ga nanoparticles.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. The appended claims are not to be interpreted as including means-plus-function limitations, unless such a limitation is explicitly recited in a given claim using the phrase "means for."

What is claimed is:

1. A composition of matter comprising:
   a powder or solution containing coated nanoparticles made of core nanoparticles, coated with one or more layers containing one or more elements of group IB, IIIA or VIA, wherein each core nanoparticle contains an element of group IB, IIIA or VIA, wherein at least one of the one or more layers contains an element that is different from one or more of the group IB, IIIA or VIA elements on the core nanoparticle.

2. The composition of claim 1 wherein the core nanoparticles include copper and/or indium and/or gallium and/or aluminum.

3. The composition of claim 2 wherein the one or more layers include a layer of indium.

4. The composition of claim 3 wherein the one or more layer includes a layer of gallium.

5. The composition of claim 1 wherein the core nanoparticles include copper and gallium.

6. The composition of claim 5 wherein the one or more layers include a layer of indium.

7. The composition of claim 5 wherein the core nanoparticles include copper core nanoparticles coated with indium and copper core nanoparticles coated with gallium.

8. The composition of claim 1 wherein the coated nanoparticles are mixed with other components to form an ink, paint or paste.

9. The composition of claim 8 wherein the other components include one or more dispersants, binders and/or resins, emulsifiers, anti-foaming agents, defoaming agents, dryers, solvents, fillers, extenders, thickening agents, film conditioners, anti-oxidants, flow and leveling agents, plasticizers and/or preservatives.

10. An optoelectronic device, comprising:
an electrode and a transparent electrode;
an absorber layer disposed between the electrode and the transparent electrode, wherein the absorber layer contains elements of groups IB, IIIA and VIB; and
a window layer disposed between the absorber layer and the transparent electrode, wherein the absorber layer is formed from the composition of claim 1.

11. The device of claim 10 wherein the absorber layer includes copper, indium, and selenium or sulfur.

12. The device of claim 11 wherein the absorber layer further includes gallium.

13. The device of claim 10 wherein the transparent electrode includes a transparent conductive polymeric layer.

14. The device of claim 13 wherein the transparent conductive polymeric layer includes poly-3,4-ethylenedioxythiophene (PEDOT) doped with poly(styrenesulfonate) (PSS).

15. The device of claim 10 wherein the transparent electrode includes a layer of zinc oxide.

* * * * *